United States Patent [19]

Alferness

[11] Patent Number: 4,826,282
[45] Date of Patent: May 2, 1989

[54] OPTICAL COMMUNICATIONS LASER INCLUDING A RESONATOR FILTER

[75] Inventor: Rodney C. Alferness, Holmdel, N.J.

[73] Assignee: American Telephone and Telegraph Company, AT&T Bell Laboratories, Murray Hill, N.J.

[21] Appl. No.: 76,237

[22] Filed: Jul. 21, 1987

Related U.S. Application Data

[63] Continuation-in-part of Ser. No. 782,133, Sep. 30, 1985, Pat. No. 4,750,801.

[51] Int. Cl.⁴ .............................................. G02B 6/10
[52] U.S. Cl. .................................. 350/96.12; 372/20; 372/32; 372/50
[58] Field of Search ................. 350/96.12; 372/20, 32, 372/50, 96

[56] References Cited

U.S. PATENT DOCUMENTS 4,309,667 1/1982 Di Forte et al. ............... 372/96 XR
4,532,632 7/1985 Yamashita et al. ............... 372/20 X Primary Examiner—John D. Lee
Assistant Examiner—Phan T. Heartney
Attorney, Agent, or Firm—Peter A. Businger

[57] ABSTRACT

A structure of first and second grating sections separated by a phase-shift section serves as a narrow-band resonator filter. Such structure may be optically coupled to a semiconductor laser cavity, and the resulting assembly can serve as a tunable narrow-linewidth laser, e.g., in wavelength-multiplexed and coherent-lightwave communications systems.

10 Claims, 3 Drawing Sheets

OPTICAL COMMUNICATIONS LASER INCLUDING A RESONATOR FILTER

CROSS-REFERENCE TO RELATED APPLICATION

This is a continuation-in-part application of the present inventor's pending application Ser. No. 782,133, filed Sept. 30, 1985 (now U.S. Pat. No. 4,750,801).

TECHNICAL FIELD

This invention relates generally to the field of optical devices and particularly to optical fibers as well as to devices which incorporate such optical filters.

BACKGROUND OF THE INVENTION

Optical filters are important in numerous applications including both optical signal processing and optical communications applications. Likely uses for optical filters include, but are not limited to, wavelength division multiplexing, wavelength discrimination in frequency shift keying (FSK) coherent detection schemes as well as spontaneous emission noise filtering for optical amplifiers. As might be expected, several approaches have been taken in attempts to fabricate optical filters.

Waveguide reflection gratings provide one means of obtaining narrow band wavelength discrimination. This type of filter has been demonstrated in both glass and semiconductor waveguides. See, for example, *Applied Physics Letters*, 24, pp. 194–196, 1974, and *Applied Physics Letters*, 45, pp. 1278–1280, 1984. However, there are drawbacks to this type of grating. It is difficult to obtain the desired narrow bandwidths. If the fliter is made with strong coupling between the light and the grating, the light is reflected before seeing the entire grating, and the bandwidth is relatively large. If it is made with weak coupling between the light and grating, it must also be made long. In this case, the problems of obtaining both uniform grating and waveguide effective index become very difficult. In spite of these difficulties, filter bandwidth of approximately 6 Angstroms has been obtained for a center wavelength of $\lambda = 1.66$ $\mu$m. It is often desired, however, for many applications that a filter bandwidth less than 1 Angstrom be obtained. Additionally, for some applications, a filter that works in transmission, rather than reflection, is desired.

SUMMARY OF THE INVENTION

A grating resonator filter comprising a substrate and, on said substrate, first and second grating sections and a section of changed effective refractive index, said latter section being between said first and second grating sections yields a grating resonator. The two sections are effectively phase shifted with respect to each other by the reduced effective refractive index section which yields the desired $\pi/2$ phase shift. The changed effective refractive index section may be termed a phase shift section. In other words, the required $\pi/2$ phase shift is obtained by using a nongrating section having a different refractive index than the grating sections have. In one preferred embodiment, the filter is fabricated with semiconductor materials such as Group III-V compound semiconductors including InGaAsP. In yet another embodiment, an electro-optic material is used and an electrode contacts the phase shift section to permit frequency tuning of the optical fiter. In still another preferred embodiment, the phase shift section is formed by etching. This produces a reduced effective refractive index. More generally, the phase shift section may have a different refractive index or dimension relative to the grating sections. The filter is useful in devices such as modulators, optical amplifiers, wavelength division multiplexing, as well as other device applications.

In one such application, a resonator filter is optically coupled to a semiconductor laser cavity, and a resulting narrow-linewidth laser is suitable as a light source, e.g., in coherent-lightwave communications systems.

For reasons of clarity, the elements of the devices depicted are not drawn to scale.

DETAILED DESCRIPTION

Figure 1:
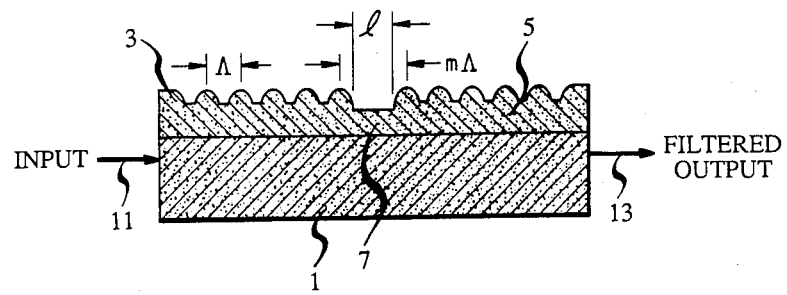
FIG. 1 is a sectional view of an embodiment according to this invention.

An exemplary embodiment of a waveguide grating resonator filter according to this invention is schematically depicted in FIG. 1. It comprises substrate 1 and first grating section 3 and second grating section 5 which are disposed on substrate 1. There is also a section 7 between the first and second grating sections and which is termed the phase shift or changed effective refractive index section. The phase shift section has a refractive index which is different from the refractive indices of the grating sections. The first and second grating sections are geometrically in phase with each other. That is, the distance between a grating peak in the first section and any one in the second grating section is an integer number of grating periods. These gratings are first order gratings with a period $\Lambda$. The phase shift section has a length l. The substrate has a lower refractive index than do the first and second grating sections. Also depicted are the input radiation 11 and filtered output radiation 13.

Conventional fabrication techniques may be used to fabricate the grating resonator filter. That is, well-known and conventional lithographic and epitaxial crystal growth techniques may be used. For example, InGaAsP waveguide layers of approximately 0.7 $\mu$m thickness and having a bandgap wavelength of approximately 1.1 $\mu$m may be grown on n-type, less than $10^{18}/cm^3$ InP substrates. Other thicknesses and bandgaps may be used. Photoresist is then deposited on the epitaxial layer. First-order gratings having a period $\Lambda$ of 0.2340 $\mu$m are interferometrically written in the photoresist, and then transferred to the quaternary InGaAsP layer by etching with a saturated bromine and phosphoric acid solution. Typical grating depths are between 700 and 1,000 Angstroms with the precise depth depending in well-known manner upon the ethcing time. the photoresist grating mask is now removed and a section having a length l, is then chemically etched in the planar grating using a photolithographically delineated mask. The etched space or section is typically approximately 500 Angstroms deeper than the grating valleys. The length of the grating reflector is approximately 500 μm. No residual grating was observed by using a scanning electron microscope. The etched region forms a region of reduced refractive index, i.e., a phase shift section, between the first and second grating sections. This fabrication method insures that with respect to light propagating in the waveguide, the first and second sections are not optically in phase.

The reduced effective refractive index section produces an effective phase shift as it has a section of reduced waveguide thickness and, therefore, of reduced effective refractive index. To obtain the desired relative phase between the two gratings at the resonant wavelength it is required that $$(N_1-N_2)l=\lambda_o/4 \qquad (1)$$

where l is the length of the etched section and $N_1$ and $N_2$ are the effective refractive indices of the grating sections and the etched sections, respectively. The resonant wavelength is $\lambda_o$. The same requirement must be satisfied if the phase shift section has an increased refractive index.

Other embodiments are contemplated. For example, a channel waveguide could be fabricated with the width of the phase shift section differing from the widths of the grating sections. Different fabrication techniques offer possibilities of changing the actual refractive index of the phase shift section with respect to the refractive index of the grating sections. For example, different metals could be indiffused in the grating and phase shift sections to form waveguides of different refractive indices. If semiconductor materials are used, the etching step previously described could be followed by selective regrowth in the etched area of a semiconductor material having a material composition and refractive index different from the grating sections.

Each grating reflector has an identical stopband wavelength region centered about the desired resonant wavelength where it is strongly reflecting. When the above equation (1) is satisfied, strong reflections from the two grating sections are out of phase and result in strong transmission at the resonant wavelength.

A variety of materials for the waveguide may be used. For example, semiconductors such as Group III-V compound semiconductors including InGaAsP may be used. Additionally, lithium noibate may be used. The latter material does not appear as desirable as do the compound semiconductors as there is a relatively small refractive index difference between the waveguide and the substrate and the known techniques for etching lithium noibate do not etch lithium noibate as easily as do the comparable techniques for the etching of semiconductors. However, it has very low loss which is advantageous for very narrow-band resonator filters with low insertion loss. The Group III-V compound smeiconductors appear desirable because a large refractive index difference between epitaxial layer and the substrate may be obtained. Additionally, silica may be used.

Figure 2:
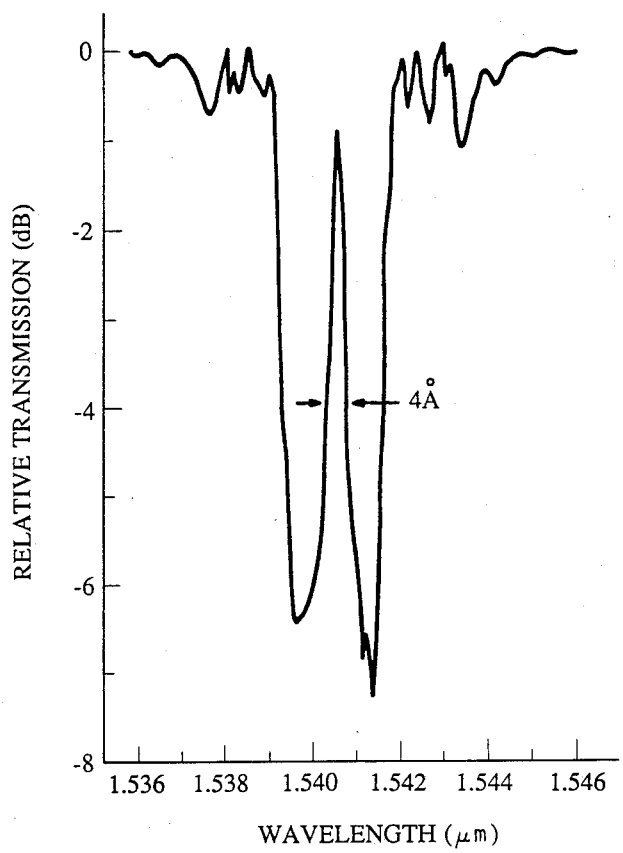
FIG. 2 plots the wavelength horizontally versus the relative transmission vertically for a filter according to this invention.

The response for an exemplary grating resonator according to this invention is depicted in FIG. 2 with the wavelength in μm plotted horizontally versus the relative transmission plotted vertically. The measured response has the shape expected, i.e., an approximately 30 Angstroms wide stopband characteristic of grating reflectors with a single transmission resonance in the center. The resonance width, that is, the full width at half maximum, is approximately 4 Angstroms. The excess resonator loss is approximately 0.9 dB. This permits the waveguide losses to be estimated at 5dB/cm, which is a value consistent with losses in similar uncorrugated waveguides. Assuming this loss coefficient is accurate, the filter bandwidth is not loss-limited but rather is limited by leakage through the grating mirrors.

With a resonator having increased grating reflectivity, both the width and depth of the stopband can be increased and the resonance bandwidth decreased. Filter bandwidths as small as 1 Angstrom have been obtained. For the waveguide losses mentioned, a filter bandwidth less than 0.25 Angstrom should be achievable.

Figure 3:
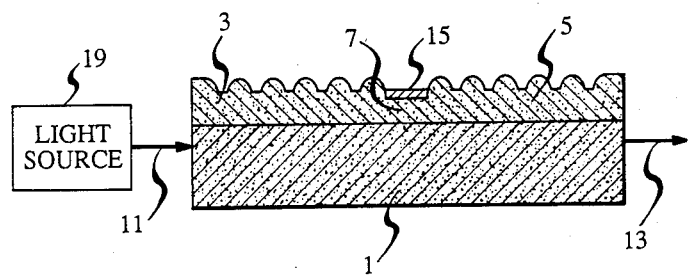
FIG. 3 is a sectional view of another embodiment according to this invention.

The filter is useful in numerous devices. For example, it may be used with an optical amplifier as shown in FIG. 3. In addition to the elements described with respect to FIG. 1 and designated by identical numerals, the filter also comprises an electrode 15 to the reduced effective refractive index section. A source 19 of input light is also shown. The source is typically a laser; for example, a semiconductor laser, and is optically coupled to the first grating section, i.e., its emitted light enters the first grating section. This source has a spectrum broader than that desired. The electrode permits tuning of the passband to the desired frequency.

The filter may also be used to modulate light from a laser. This is easily done by using the embodiment depicted in FIG. 3. The electrode, upon application of an appropriate voltage, modulates the electro-optic effect, and thereby changes the position of the resonant wavelength. This permits the effective transmission of the filter to be varied between two values such as 0.0 and 1.0.

The phase shift section used need not be positioned symmetrically with respect to the first and second grating sections. For some situations, it is desirable that a grating length on the input side be of a different length than on the output side.

Other embodiments are contemplated. For example, it will be readily appreciated that the filters may be cascaded. That is, more than two grating sections may be used with a corresponding increase in the number of reduced effective refractive index sections. Additionally, second order gratings may be used for some applications.

Figure 4:
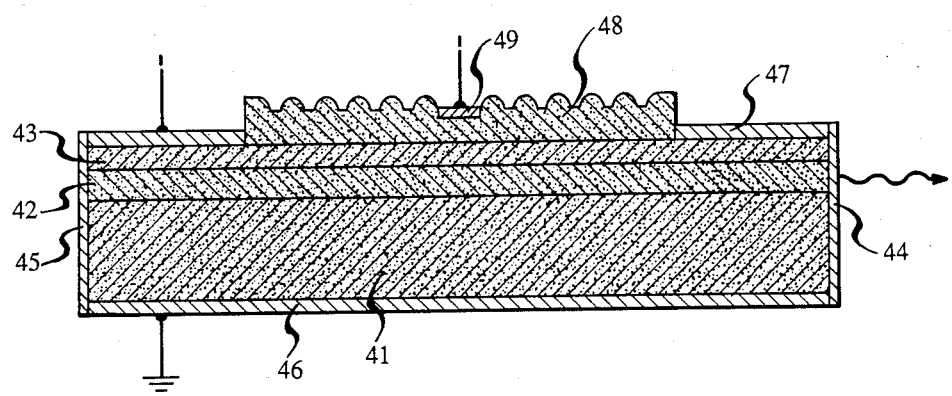
FIG. 4 is a sectional view of a semiconductor laser including a resonator filter, representing a preferred embodiment of the invention.

Contemplated further is the inclusion of a resonate filter as an intra-cavity feature in a semiconductor laser. For example, as shown in FIG. 4, a laser may comprise substrate 41, active layer 42, cladding layer 43, partially reflecting mirror 44, totally reflecting mirror 45, contact layers 46 and 47 for application of (forward-biased) driving voltage, resonator filter layer 48, and contact 49 to a phase-shift section of resonator filter layer 48. For the sake of low-loss optical coupling between active layer 42 and (passive) resonator filter layer 48, the material of the latter is preferably chosen to ahve a bandcap which is less than the bandgap of the material of the former, desired equality of effective refractive index in the two layers being achieved geometrically, e.g., by suitable choice of layer thickness. Thus, typically, the thickness of resonator filter layer 48 is greater than the thickness of active layer 42. Resulting relatively broad-band coupling between active and resonator filter layers, combined with filter characteristics as exemplified in FIG. 2, results in preferred narrow-linewidth output from the device.

Preferred laser structure in accordance with FIG. 4 is such that laser operation does not involve pumping of the portion of the active layer along the length of the resonator filter layer. As a result, light traveling straight through the active layer is lost—as is advantageous in the interest of narrowness of laser linewidth.

Manufacture of the structure shown in FIG. 4 may involve deposition of layer 48 in the presence of a mask; alternatively, the material of layer 48 may be deposited on all of layer 43, followed by removal of portions of layer 48 material and deposition of contacts 47, e.g., by evaporation. Another convenient approach does not involve selective deposition or removal of layer 48 material, with contacts 48 deposited on portions of layer 48 away from the grating resonator sections. Among suitable specific materials and fabrication procedures are those mentioned above with respect to resonator filters in general.

When suitably tuned or adjusted, a laser in accordance with this embodiment of the invention is capable of single-frequency, narrowlinewidth operation. Preferred tuning is such that the resonant wavelength of the filter at least approximately coincides with a Fabry-Perot peak of the resonant cavity. Typically, tuning capability is over a wavelength range of 10 to 20 Angstroms, permitting adjustment of laser operating wavelength to one of several nominal values as desired, e.g, in wavelength-multiplexed systems. Not precluded is the use of external feedback, e.g., for laser stabilization.

Tuning may be effected with low loss, e.g., via the electro-optic effect in a phase-shift section of filter 48 upon application of a reversebiased voltage between electrodes 46 and 49. To achieve larger changes in refractive index as compared with the relatively small changes achievable electro-optically, tuning may be effected by current injection under forward-biased conditions; this approach, however, entails larger loss as compared with electro-optic tuning.

A resulting laser is considered to be particularly suited, e.g., for use as an optical source in wavelength-multiplexed and coherent-lightwave communications systems.

What is claimed is:

1. An optical communications laser, said laser comprising a substrate-supported layer which is capable of emitting light and which is situated between first and second means for providing optical feedback in said layer, means for supplying an electrical current to said layer, and a resonator filter element in optical coupling relationship with said layer, said resonator filter element comprising spaced-apart first and second grating sections.

2. The laser of claim 1, the material of said resonator filter element having a bandgap which is less than the bandgap of the material of said layer capable of emitting light.

3. The laser of claim 1, further comprising electrical means for adjusting the resonant wavelength of said filter element.

4. The laser of claim 1, said resonator filter element comprising means for adjusting the refractive index in the space between said first and second grating sections.

5. The laser of claim 4, said means for adjusting the refractive index comprising an electrical contact.

6. The laser of claim 4, said sections comprising a compound semiconductor material.

7. The laser of claim 6, said compound semiconductor material comprising a Group III-V material.

8. The laser of claim 4, said sections comprising lithium noibate.

9. The laser of claim 4, said sections comprising silica.

10. A method for optical communications, said method comprising operating a communications laser at or near a specific wavelength, the wavelength of said laser being tuned to said specified wavelength by means of a resonator filter which is optically coupled to a laser-active layer between first and second feedback-producing means, said resonator filter element comprising spaced-apart first and second grating sections.

* * * * *